United States Patent [19]

Kenny et al.

[11] Patent Number: 4,691,263
[45] Date of Patent: Sep. 1, 1987

[54] LOW LEAKAGE, SOLID STATE A-C POWER CONTACT

[75] Inventors: Thomas J. Kenny; James F. Sutherland, both of Plum Borough, Pa.

[73] Assignee: Westinghouse Electric Corp., Pittsburgh, Pa.

[21] Appl. No.: 809,710

[22] Filed: Dec. 17, 1985

[51] Int. Cl.⁴ ............................................. H02H 3/08
[52] U.S. Cl. ........................................ 361/58; 361/91; 361/101
[58] Field of Search ....................... 361/18, 58, 56, 88, 361/91, 93-98, 100, 101; 323/265, 349, 351; 363/50, 55, 58

[56] References Cited

U.S. PATENT DOCUMENTS

| | | | |
|---|---|---|---|
| 4,277,811 | 7/1981 | Sato | 361/101 |
| 4,320,434 | 3/1982 | Stirk | 361/86 |
| 4,494,163 | 1/1985 | Yelland et al. | 361/56 |
| 4,600,963 | 7/1986 | Hertrich et al. | 361/101 |

Primary Examiner—A. D. Pellinen
Assistant Examiner—Todd E. DeBoer
Attorney, Agent, or Firm—Daniel C. Abeles

[57] ABSTRACT

A power contact with low off current for switching a-c loads in response to a logic signal includes a rectifier bridge circuit in a series with the load and the a-c power source, a MOSFET connected across the d-c terminals of the bridge, and a series RC filter circuit in parallel with the MOSFET. A metal oxide varistor connected across the d-c side of the bridge protects the MOSFET from transients in the a-c circuit. While this power contact is capable of switching sizable a-c currents, the leakage current with the MOSFET off is less than 1/10 of a milliamp so that it can also be used to switch loads which draw very low level currents. The MOSFET is electrically isolated from the logic signal by an opto-isolator which has a unique switchable output which permits the power contact to be readily adapted for use with normally energized or normally deenergized loads.

6 Claims, 2 Drawing Figures

LOW LEAKAGE, SOLID STATE A-C POWER CONTACT

BACKGROUND OF THE INVENTION

1. Field of the Invention

This invention relates to solid state power contacts for switching a-c power in response to logic signals and particularly to such power contacts having low leakage characteristics, yet also being capable of switching sizable currents. The invention further relates to power contacts in which the logic circuit controlling the switch is electrically isolated from the a-c circuit being switched and in which the contact is protected from surges in the a-c circuit.

2. Prior Art

It is common today to use low level d-c logic signals to control a-c power circuits. For instance, in many applications the output of a digital computer is used to control components energized by an a-c power source. These components can include a wide range of devices from highly inductive loads such as motors which draw a substantial amount of current to indicators such as neon bulbs which only draw 1 to 2 milliamperes of current. It is highly desirable to have to provide only one type of power contact to accommodate all of these types of loads.

However, these various loads impose their own sometimes opposing limitations on the power contact. The highly inductive loads generate switching transients which must be suppressed to protect the contacts. The load devices operated by very low currents require that the power contacts have very low leakage current when in the off state in order to deenergize these devices. Unfortunately, the devices normally used to suppress the transients caused by the inductive loads add to the leakage current. The whole problem is further compounded in instrumentation circuits which must meet IEEE surge protection specifications.

Relays are one type of device used as power contacts in computer interfaces. In addition to being comparatively slow, consuming substantial power and not being as dependable as solid state switches, relays require sizeable RC snubber circuits across the contacts to suppress the transients generated by inductive loads. In one application where the leakage current through the snubber was substantial enough to cause a stepper motor being controlled to skip positions, a rectifier bridge circuit was inserted between the a-c circuit and the relay so that the contacts switched d-c current to control the a-c current.

Solid state switches such as back to back thyristors and triacs are also used to control a-c circuits with d-c logic signals. These devices also require RC snubbers to suppress switching transients in the a-c circuit which also generate a-c leakage currents unacceptably high for the very low current loads such as neon indicator bulbs.

SUMMARY OF THE INVENTION

In accordance with the present invention, a solid state power contact for switching an a-c power source in response to a digital logic signal utilizes a MOSFET as the switching device. The MOSFET is inserted into the a-c circuit through a rectifier bridge circuit connected in series with the a-c source and the load. A series resistance capacitor filter circuit connected across the MOSFET at the d-c terminals of the rectifier bridge, provides the constant d-c voltage for operation of the MOSFET.

The MOSFET is protected from transients in the a-c current by surge suppression means, such as a metal oxide varistor, connected across the d-c terminals of the rectifier bridge which limits the voltage applied by the transient to the MOSFET to a value between the peak voltage of the a-c waveform and the rated voltage of the switching device. In the preferred embodiment of the invention where the MOSFET is electrically isolated from the digital logic signal and is referenced to a floating ground, additional surge suppression means are connected between the MOSFET source electrode and earth ground.

The leakage current, that is the current with the MOSFET turned off, is determined by the components on the a-c side of the bridge, namely the surge suppression means and the MOSFET. Thus, the invention avoids the sizable a-c leakage currents which have plagued most prior art a-c power contacts. The leakage current of the subject invention is below that which would sustain energization of even load devices which operate at very low current levels, and in the exemplary embodiment of the invention, the leakage current is less than about 1/10 milliamp. Since the MOSFET is capable of handling large currents also, the power contact of the invention is useful for switching a-c power to a variety of loads having widely varying current requirements.

In accordance with another aspect of the invention, the digital logic signal is applied to the gate electrode of the MOSFET through a drive circuit which selectively provides for the MOSFET to be either turned on or off in response to an active logic signal. This feature is provided, together with electrical isolation of the MOSFET, by an opto-isolator having its output transistor connected across two output terminals. The first output terminal is connected to a floating power supply through a first output resistor and the second is connected to a floating ground through a second output resistor. By connecting a jumper between one output terminal and the gate of the MOSFET and shunting the output resistor connected to the other output terminal, a selection can easily be made between a drive signal for the MOSFET which either has the same sense or is complimentary to the logic signal. Thus, the power contact of the invention is easily adapted for use in controlling normally engergized or normally deenergized loads with a digital logic signal.

BRIEF DESCRIPTION OF THE DRAWING

A full understanding of the invention can be gained from the following description of the preferred embodiment when read in conjunction with the following drawings in which.

DESCRIPTION OF THE PREFERRED EMBODIMENT

Figure 1:
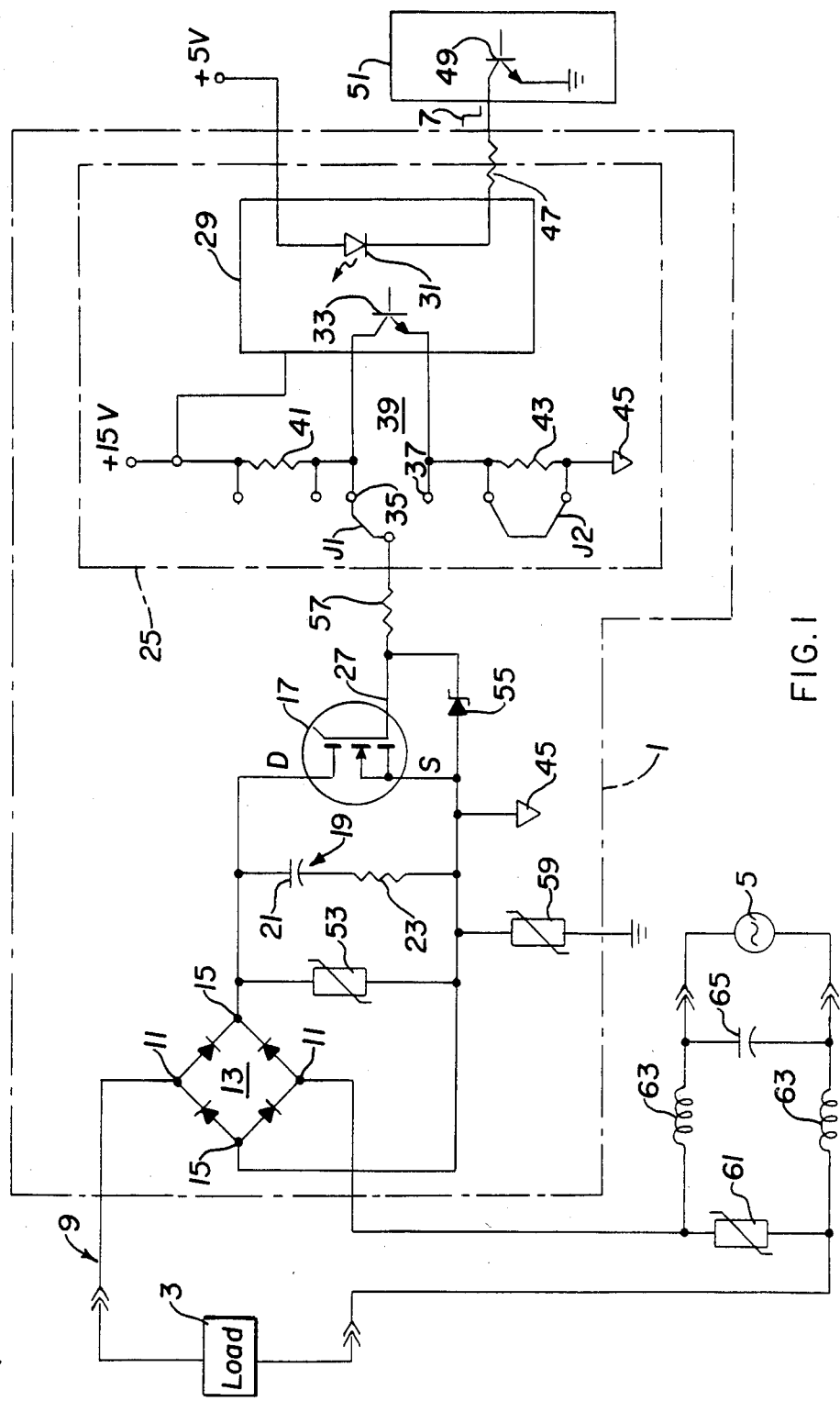
FIG. 1 is a schematic circuit diagram of the power contact of the invention configured for a normally deenergized load.

As shown in the drawing, the power contact 1 of the invention controls the energization of a load 3 by an a-c power source 5 in response to a logic signal 7. The a-c power source 5 typically provides 120 volt, 60 hertz power to the a-c circuit 9. The a-c terminals 11 of a rectifier bridge circuit 13 are connected in series with the load 3 and the a-c source 5. The d-c terminals 15 of the rectifier bridge circuit 13 are connected to the source (S) and the drain (D) electrodes of a MOSFET 17. A suitable MOSFET is the IRF 451 n-channel enhancement mode device manufactured by International Rectifier Corporation which has a drain source voltage rating of 450 volts and can handle up to 13 amperes of current with a forward resistance of about ¼ ohm. A filter circuit 19 comprising series connected capacitor 21 and resistor 23 is connected in parallel with the MOSFET 17 across the d-c terminals of the rectifier bridge circuit 13. This filter circuit 19 smooths out the half waves of the d-c signal produced by the rectifier bridge circuit so that a constant d-c voltage equal to the peak voltage of the a-c waveform, which is approximately 170 volts, is applied to the MOSFET 17. Suitable values for these components in the exemplary filter are 1 to 4 microfarads for the capacitor 21 and 20 ohms for the resistor 23.

The MOSFET 17 is controlled by a drive circuit 25 connected to the gate electrode by a lead 27. The drive circuit includes an opto-isolator 29 such as a 6N139. Such an opto-isolator includes an LED 31 at its input which, when energized, turns on a photo transistor (not shown) to provide an output which is electrically isolated from the input as is well known. The output of the opto-isolator 29 includes a transistor 33 having its collector connected to a first output terminal 35 and its emitter connected to a second output terminal 37 in a selector circuit 39 within the drive circuit 25. The collector is also connected, through a first output resistor 41 to a floating +15 volt d-c supply. In a similar fashion, the emitter is connected through a second output resistor 43 to a floating ground 45. The source electrode of the MOSFET 17 is connected to the same floating ground 45.

The anode of the LED 31 at the input to the optoisolator 29 is connected to a +5 volt supply while the cathode is connected through a current limiting resistor 47 to the open collector of a transistor 49 in the output stage of a logic circuit 51 which generates the logic signal 7. With the transistor 49 turned off, the LED is deenergized so that the transistor 33 is also turned off. With transistor 49 turned on, the LED 31 conducts and transistor 33 is turned on.

Figure 2:
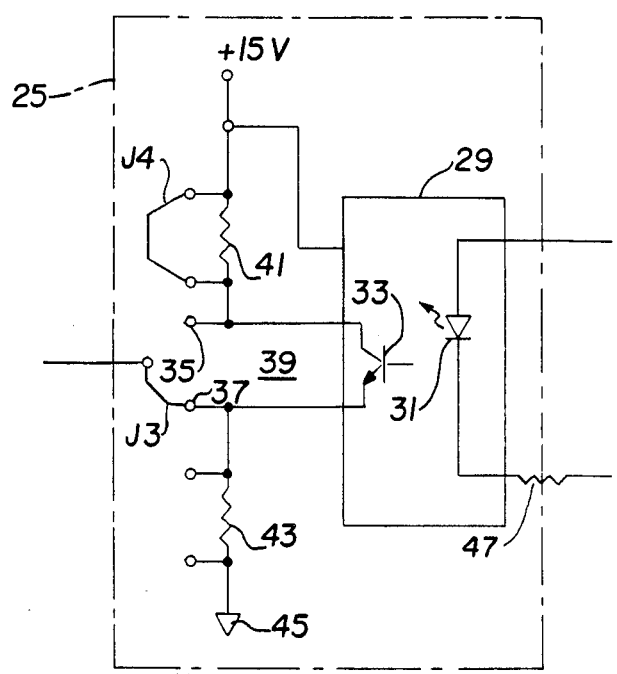
FIG. 2 is a schematic circuit diagram of a portion of the power contact of FIG. 1 configured for a normally energized load.

The selector circuit 39 provides the capability of generating a gate signal for the MOSFET 17 which has the same sense as the logic signal 7 or which is complimentary to it. For instance, by connecting the first output terminal 35 to the lead 27 with a jumper J1 and shunting the resistor 43 with a jumper J2 as shown in FIG. 1, a signal is applied to the gate of MOSFET 17 which is complimentary to the logic signal 7, since with the logical signal inactive, the transistor 33 is off and the +15 volts of the floating supply is applied to the gate. With the logic signal 7 active, the transistor 33 is turned on so that the gate of the MOSFET 17 is at virtually the potential of the floating ground. On the other hand, with the jumpers J1 and J2 removed and a jumper J3 connecting the lead 27 to terminal 37 and a jumper J4 shunting resistor 41 as shown in FIG. 2, the gate of the MOSFET 17 is at almost 15 volts when the logic signal 7 is active and the transistor 33 is on, while the gate is at the potential of the floating ground when the logic signal is off.

With the 15 volt signal from the floating power supply applied to lead 27, the MOSFET 17 is turned on to energize the load 3 from the a-c source 5. Where the power contact of the invention is used in an application which calls for safe failure modes such as the protection system for a nuclear reactor, the logic signal 7 can be used as a trip signal for initiating automatic responses to an abnormal condition. Under these conditions, logic signal 7 can be generated as an active signal under normal conditions and an inactive signal under trip conditions so that failure of the logic signal generating circuit will result in a trip signal. For a normally energized load then, that is a load which is energized in the absence of a trip signal and deenergized by a trip, jumpers J3 and J4 should be used so that MOSFET 17 is turned on under normal conditions and is turned off by a trip. For the normally deenergized load, jumpers J1 and J2 should be used so that the MOSFET 17 is turned on when a trip signal is generated.

In order to protect the MOSFET 17 from transients in the a-c circuit 9, a surge suppressor in the form of a metal oxide varistor (MOV) 53 is placed in parallel with the MOSFET 17 across the d-c terminals 15 of the rectifier bridge circuit 13. A suitable MOV is a GE 180ZA1 manufactured by the General Electric Company which has a normal breakdown voltage of 180 volts which is just above the 170 volts d-c generated by the rectifier bridge circuit in the absence of transients. This particular varistor will limit the voltage appearing across the MOSFET 17 to 300 to 350 volts in response to the 3,000 volt, 1 megahertz transient which decays exponentially by 50% in 6 microseconds called for by IEEE instrumentation surge protection Standard 472-1974. This peak voltage during the transient is well below the 450 volt drain to source voltage rating of the MOSFET. Transorbs also could provide the surge protection required for the MOSFET in the subject power contact. Whatever device is used for surge protection, it must also have very low leakage current below the breakdown voltage for reasons to be discussed below.

A zener diode 55 operates in cooperation with a resistor 57 to clamp the gate to source voltage of the MOSFET 17 to 15 volts to protect the transistor from transients on the lead 27. Additional surge protection is provided for the power contact by a MOV 59 connected between the source electrode of MOSFET 17, which is at floating ground potential, and earth ground. Another MOV, 61, blocks transients from the load 3 or its associated wiring from being transmitted to other circuits similar to that shown in the drawing which are served by the a-c source 5. Ferrite beads 63 and capacitor 65 filter out any RF noise that might be generated in the load circuit.

As can be appreciated from the above discussion, the disclosed power contact can handle loads which draw sizable a-c currents and is well protected from transients. The purpose of the invention, however, is to provide a versatile power contact that can be used with a wide variety of loads including loads that draw a small amount of a-c current in their energized state. Thus, in making a power contact robust enough to handle sizable currents and, in protecting it from transients, the ability to switch low level currents must not be sacrificed. The difficulty arises if the leakage current with the switch open is of sufficient magnitude to sustain energization of the load. Some loads such as neon indicator bulbs draw only about 1 milliamp of current from a 120 volt supply. The snubbers connected around the contacts of a-c switches can easily draw this much a-c leakage current. With the rectifier bridge circuit in the power contact circuit, it is leakage current on the d-c side of the bridge that must be controlled. This is basically a matter of the off drain to source resistance of the MOSFET 17 and the resistance of the varistor 53. Since the filter 19 is on the d-c side of the bridge, there is no a-c leakage current through it as would be the case with snubbers across a-c contacts. The combined resistance of the MOSFET 17 when it is off and the varistor 53 using the components noted above is approximately 2 megohms. Thus, at the operating voltage of 170 volts, the leakage current is less than 1/10 of a milliamp which is significantly less than that required to sustain energization of a neon bulb.

While a specific embodiment of the invention has been described in detail, it will be appreciated by those skilled in the art that various modifications and alternatives to those details could be developed in light of the overall teachings of the disclosure. Accordingly, the particular arrangement disclosed is meant to be illustrative only and not limiting as to the scope of the invention which is to be given the full breadth of the appended claims and any and all equivalents thereof.

What is claimed is:

1. A low off current solid state power contact used in switching an a-c power source supplying an a-c load in an a-c circuit in response to a digital logic signal referenced to earth ground, said power contact comprising:
    a rectifier bridge circuit having a pair of a-c terminals connected in series with the a-c source and the load, and a pair of d-c terminals,
    a MOSFET having its source and drain terminals connected at the d-c terminals of said rectifier bridge circuit with the digital logic signal connected to its gate electrode, and
    a series, resistor capacitor filter circuit connected in parallel with said MOSFET directly across the d-c terminals of said rectifier bridge circuit, said capacitor and resistor values being selected such that, with the MOSFET turned off, the current in the a-c circuit is less than that required to maintain energization of the load.

2. The power contact of claim 1 including a drive circuit having an input to which said digital logic signal is applied, an output connected to the gate electrode of said MOSFET, and selective output signal generating means for generating a digital output signal at the output having the same sense as the digital logic signal and for selectively, alternatively generating a digital output signal complimentary to the input signal, whereby the MOSFET may be selectively turned on or off by the logic signal and therefore be used to control normally energized or normally deenergized loads.

3. The power contact of claim 2 wherein said drive circuit includes means for electrically isolating the input from the output such that the MOSFET and a-c circuit are electrically isolated from the digital logic signal.

4. The power contact of claim 3 wherein said means for electrically isolating the input from the output comprises an opto-isolator.

5. The power contact of claim 4 wherein said selective output signal generating means for said drive circuit includes first and second output terminals and the opto-isolator includes an output transistor having one output lead connected to the first output terminal and a second output lead connected to the second output terminal, said selective output signal generating means for said drive circuit further including a floating voltage source, a first output resistor connected between the floating voltage source and the first output terminal, a second output resistor connected between the floating ground and the second output terminal, and jumpers for selectively connecting the first output terminal to the MOSFET gate and shunting the second output resistor and for alternatively connecting the second output terminal to the MOSFET gate and shunting the first output resistor.

6. The power contact of claim 1 wherein said surge suppression means and said additional surge suppression means comprise metal oxide varistors.

* * * * *